United States Patent
Grannen et al.

(10) Patent No.: US 9,136,819 B2
(45) Date of Patent: Sep. 15, 2015

(54) BULK ACOUSTIC WAVE RESONATOR HAVING PIEZOELECTRIC LAYER WITH MULTIPLE DOPANTS

(71) Applicant: Avago Technologies General IP (Singapore) Pte. Ltd., Singapore (SG)

(72) Inventors: Kevin J. Grannen, Thornton, CO (US); Ivan Ionash, Fort Collins, CO (US); Chris Feng, Fort Collins, CO (US); Tina Lamers, Fort Collins, CO (US); John Choy, Westminster, CO (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 229 days.

(21) Appl. No.: 13/662,460

(22) Filed: Oct. 27, 2012

(65) Prior Publication Data

US 2014/0118090 A1     May 1, 2014

(51) Int. Cl.
*H03H 9/15* (2006.01)
*H03H 9/02* (2006.01)
*H03H 9/13* (2006.01)
*H03H 9/17* (2006.01)

(52) U.S. Cl.
CPC ....... *H03H 9/02015* (2013.01); *H03H 9/02047* (2013.01); *H03H 9/132* (2013.01); *H03H 9/173* (2013.01); *H03H 9/175* (2013.01)

(58) Field of Classification Search
CPC .......... H03H 9/02015; H03H 9/02031; H03H 9/02047; H03H 9/132; H03H 9/173; H03H 9/175

USPC .......... 333/187–192; 310/322, 324, 334, 335, 310/358
See application file for complete search history.

(56) References Cited

U.S. PATENT DOCUMENTS

| | | | | |
|---|---|---|---|---|
| 4,490,641 A | * | 12/1984 | Takeuchi et al. | 310/366 |
| 5,587,620 A | | 12/1996 | Ruby et al. | |
| 5,873,153 A | | 2/1999 | Ruby et al. | |
| 6,074,971 A | * | 6/2000 | Chiu et al. | 501/139 |
| 6,107,721 A | | 8/2000 | Lakin | |
| 6,129,886 A | * | 10/2000 | Tachimoto et al. | 264/614 |
| 6,384,697 B1 | | 5/2002 | Ruby | |
| 6,507,983 B1 | | 1/2003 | Ruby et al. | |
| 6,583,688 B2 | * | 6/2003 | Klee et al. | 333/188 |
| 6,709,557 B1 | | 3/2004 | Kailasam et al. | |
| 6,811,719 B2 | * | 11/2004 | Uchino et al. | 252/62.9 PZ |

(Continued)

FOREIGN PATENT DOCUMENTS

| | | |
|---|---|---|
| JP | 8-319158 | * 12/1996 |
| JP | 2009201101 A | 9/2009 |
| WO | 2011004601 A1 | 1/2011 |

OTHER PUBLICATIONS

IEEE Xplore Abstract only for "Reactive Magnetron Sputtering of Piezoelectric Cr-Doped AlN Thin Films", Oct. 18-21, 2011, 2 pages.*

(Continued)

*Primary Examiner* — Barbara Summons

(57) ABSTRACT

A bulk acoustic wave (BAW) resonator structure includes a first electrode disposed over a substrate, a piezoelectric layer disposed over the first electrode and a second electrode disposed over the first piezoelectric layer. The piezoelectric layer is formed of a piezoelectric material doped with multiple rare earth elements for improving piezoelectric properties of the piezoelectric layer.

20 Claims, 4 Drawing Sheets

(56) References Cited

U.S. PATENT DOCUMENTS

| | | | |
|---|---|---|---|
| 6,936,837 B2 | 8/2005 | Yamada et al. | |
| 7,180,224 B2 * | 2/2007 | Bouche et al. | 310/320 |
| 7,275,292 B2 | 10/2007 | Ruby et al. | |
| 7,280,007 B2 | 10/2007 | Feng et al. | |
| 7,358,831 B2 | 4/2008 | Larson, III et al. | |
| 7,388,454 B2 | 6/2008 | Ruby et al. | |
| 7,459,990 B2 * | 12/2008 | Wunnicke et al. | 333/133 |
| 7,557,055 B2 * | 7/2009 | Zhang et al. | 501/135 |
| 7,629,865 B2 | 12/2009 | Ruby | |
| 7,758,979 B2 | 7/2010 | Akiyama et al. | |
| 8,076,828 B2 * | 12/2011 | Kawada | 310/358 |
| 2002/0165080 A1 * | 11/2002 | Sengupta et al. | 501/137 |
| 2007/0205850 A1 | 9/2007 | Jamneala et al. | |
| 2010/0327697 A1 | 12/2010 | Choy et al. | |
| 2010/0327994 A1 | 12/2010 | Choy et al. | |
| 2011/0180391 A1 | 7/2011 | Larson, III et al. | |
| 2012/0104900 A1 * | 5/2012 | Nishihara et al. | 310/326 |
| 2013/0127300 A1 | 5/2013 | Umeda et al. | |
| 2014/0125202 A1 * | 5/2014 | Choy et al. | 310/365 |
| 2014/0125203 A1 * | 5/2014 | Choy et al. | 310/365 |

OTHER PUBLICATIONS

Kabulski et al., "Erbium Alloyed Aluminum Nitride Films for Piezoelectric Applications", Mater.Res.Soc.Symp.Proc. vol. 1129, Materials Research Society 2009, 5 pages.*

Dimitiu et al., "Complex Rare-earth Substituted Lead Titanate Piezoceramics", 2004 IEEE International Ultrasonics, Ferroelectrics, and Frequency Control Joint 50th Anniversary Conference, pp. 297-300, 2004.*

Ferenc Tasnadi et al., "Origin of the anomalous piezoelectric response in wurtzite ScxAl1-xN alloys", Department of Physics, Chemistry and Biology (IFM),Linkoping University, Publication date: Mar. 18, 2010, http://arxiv.org/pdf/1003.3353.pdf, pp. 1-10.

V. V. Felmetsger et al., "Reactive Magnetron Sputtering of Piezoelectric Cr-Doped AlN Thin Films", PVD Product Group OEM Group Incorporated, http://www.oemgroupinc.com/dopedAlN.pdf, pp. 1-5, published in the 2011 International IEEE Ultrasonics Symposium, Oct. 18-21, 2011, pp. 83-839.

Tuomas Pensala, "Thin Film Bulk Acoustic Wave Devices: Performance Optimization and Modeling", VTT Publications 756, http://www.vtt.fi/inf/pdf/publications/2011/P756.pdf, pp. 1-108, dissertation presented Feb. 25, 2011, copyright VTT 2011.

Ranjan et al. "Strained Hexagonal ScN: A Material with Unusual Structural and Optical Properties," Physical Review Letters, Jun. 27, 2003, vol. 90, No. 25, The American Physical Society, USA.

Farrer et al., "Properties of hexagonal ScN versus wurtzite GaN and InN," Physical Review B, Nov. 20, 2002, vol. 66, No. 20, The American Physical Society, USA.

Constantin et al., "Composition-dependent structural properties in ScGaN alloy films: A combined experimental and theoretical study," Journal of Applied Physics, Dec. 16, 2005, vol. 98, No. 12, American Institute of Physics, USA.

Akiyama et al., "Enhancement of piezoelectric response in scandium aluminum nitride alloy thin films prepared by dual reactive cosputtering," Advanced Materials, 2009, vol. 21, pp. 593-596, Japan.

Suzuki et al., "Influence of shadowing effect on shear mode acoustic properties in the c-axis tilted AlN films," IEEE Ultrasonics Symposium (IUS), 2010, pp. 1478-1481.

Yanagitani et al., "Giant shear mode electromechanical coupling coefficient k12 in c-axis tilted ScAlN films," IEEE Ultrasonics Symposium (IUS), 2010.

* cited by examiner

BULK ACOUSTIC WAVE RESONATOR HAVING PIEZOELECTRIC LAYER WITH MULTIPLE DOPANTS

BACKGROUND

Transducers generally convert electrical signals to mechanical signals or vibrations, and/or mechanical signals or vibrations to electrical signals. Acoustic transducers, in particular, convert electrical signals to acoustic signals (sound waves) and convert received acoustic waves to electrical signals via inverse and direct piezoelectric effect. Acoustic transducers generally include acoustic resonators, such as surface acoustic wave (SAW) resonators and bulk acoustic wave (BAW) resonators, and may be used in a wide variety of electronic applications, such as cellular telephones, personal digital assistants (PDAs), electronic gaming devices, laptop computers and other portable communications devices. For example, BAW resonators include thin film bulk acoustic resonators (FBARs), which include resonator stacks formed over a substrate cavity, and solidly mounted resonators (SMRs), which include resonator stacks formed over an acoustic reflector (e.g., Bragg mirror). The BAW resonators may be used for electrical filters and voltage transformers, for example.

Generally, an acoustic resonator has a layer of piezoelectric material between two conductive plates (electrodes), which may be formed on a thin membrane. The piezoelectric material may be a thin film of various materials, such as aluminum nitride (AlN), zinc oxide (ZnO), or lead zirconate titanate (PZT), for example. Thin films made of AlN are advantageous since they generally maintain piezoelectric properties at high temperature (e.g., above 400° C.). However, AlN has a lower piezoelectric coefficient $d_{33}$ than both ZnO and PZT, for example.

An AlN thin film may be deposited with various specific crystal orientations, including a wurtzite (0001) B4 structure, which consists of a hexagonal crystal structure with alternating layers of aluminum (Al) and nitrogen (N), and a zincblende structure, which consists of a symmetric structure of Al and N atoms, for example. FIG. 1 is a perspective view of an illustrative model of the common wurtzite structure. Due to the nature of the Al—N bonding in the wurtzite structure, electric field polarization is present in the AlN crystal, resulting in the piezoelectric properties of the AlN thin film. To exploit this polarization and the corresponding piezoelectric effect, one must synthesize the AlN with a specific crystal orientation.

Referring to FIG. 1, the a-axis and the b-axis are in the plane of the hexagon at the top, while the c-axis is parallel to the sides of the crystal structure. For AlN, the piezoelectric coefficient $d_{33}$ along the c-axis is about 3.9 pm/V, for example. Generally, a higher piezoelectric coupling coefficient $d_{33}$ is desirable, since the higher the piezoelectric coefficient $d_{33}$, the less material is required to provide the same piezoelectric effect. In order to improve the value of the piezoelectric coefficient $d_{33}$, some of the Al atoms may be replaced with a different metallic element, which may be referred to as "doping." For example, past efforts to improve the piezoelectric coefficient $d_{33}$ have included disturbing the stoichiometric purity of the AlN crystal lattice by adding either scandium (Sc) (e.g., in amounts greater than 0.5 atomic percent) or erbium (Er) (e.g., in amounts less than 1.5 atomic percent) in place of some Al atoms, but not both.

BRIEF DESCRIPTION OF THE DRAWINGS

The illustrative embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

Figure 1:
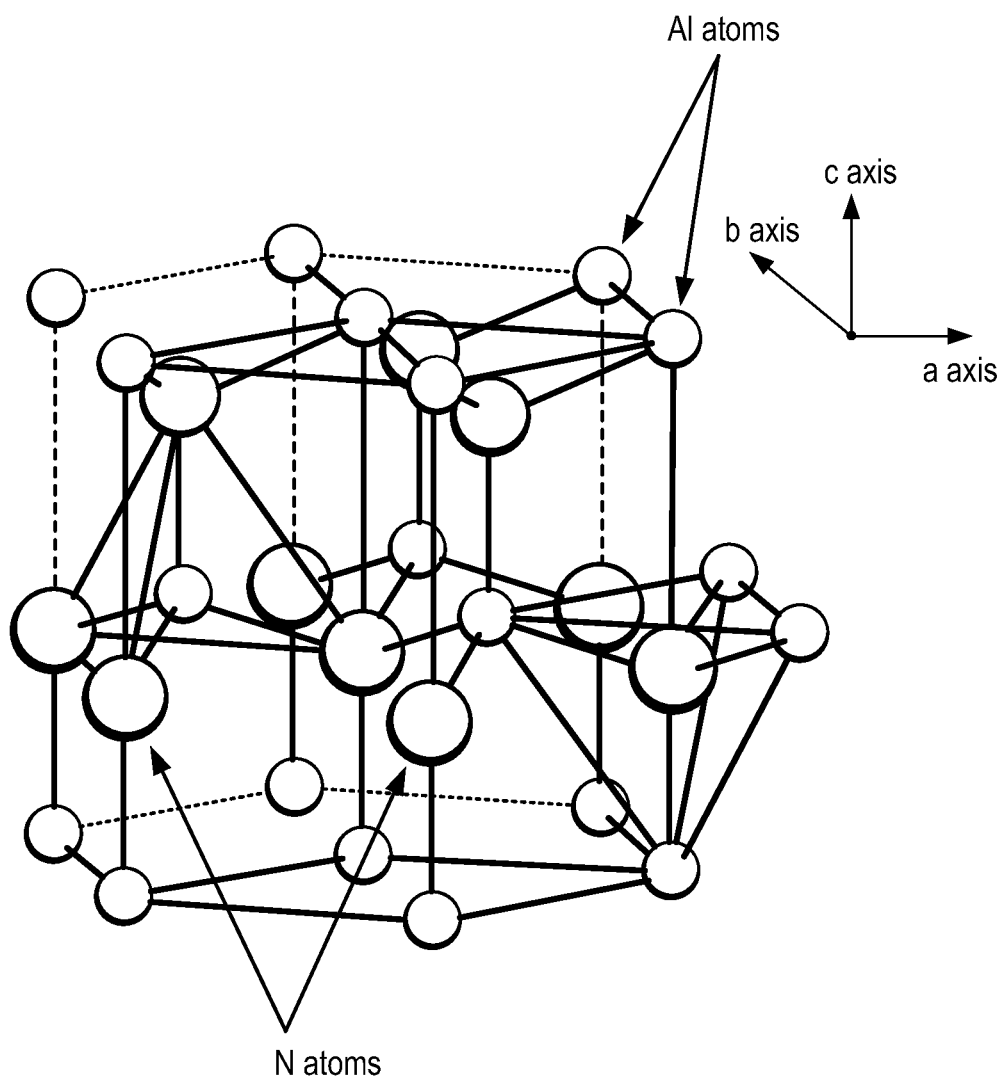
FIG. 1 is a perspective view of an illustrative model of a crystal structure of aluminum nitride (AlN).

It is to be understood that the terminology used herein is for purposes of describing particular embodiments only, and is not intended to be limiting. The defined terms are in addition to the technical and scientific meanings of the defined terms as commonly understood and accepted in the technical field of the present teachings.

As used in the specification and appended claims, the terms "a", "an" and "the" include both singular and plural referents, unless the context clearly dictates otherwise. Thus, for example, "a device" includes one device and plural devices. As used in the specification and appended claims, and in addition to their ordinary meanings, the terms "substantial" or "substantially" mean to within acceptable limits or degree. For example, "substantially cancelled" means that one skilled in the art would consider the cancellation to be acceptable. As used in the specification and the appended claims and in addition to its ordinary meaning, the term "approximately" or "about" means to within an acceptable limit or amount to one having ordinary skill in the art. For example, "approximately the same" means that one of ordinary skill in the art would consider the items being compared to be the same.

In the following detailed description, for purposes of explanation and not limitation, specific details are set forth in order to provide a thorough understanding of illustrative embodiments according to the present teachings. However, it will be apparent to one having ordinary skill in the art having had the benefit of the present disclosure that other embodiments according to the present teachings that depart from the specific details disclosed herein remain within the scope of the appended claims. Moreover, descriptions of well-known apparatuses and methods may be omitted so as to not obscure the description of the illustrative embodiments. Such methods and apparatuses are clearly within the scope of the present teachings.

Generally, it is understood that the drawings and the various elements depicted therein are not drawn to scale. Further, relative terms, such as "above," "below," "top," "bottom," "upper" and "lower" are used to describe the various elements' relationships to one another, as illustrated in the accompanying drawings. It is understood that these relative terms are intended to encompass different orientations of the device and/or elements in addition to the orientation depicted in the drawings. For example, if the device were inverted with respect to the view in the drawings, an element described as "above" another element, for example, would now be below that element.

The present teachings relate generally to BAW resonator devices that may provide various filters (e.g., ladder filters), and other devices. Certain details BAW resonators, including FBARs, SMRs and resonator filters, materials thereof and their methods of fabrication may be found in one or more of the following commonly owned U.S. Patents and Patent Applications: U.S. Pat. No. 6,107,721 to Lakin; U.S. Pat. Nos. 5,587,620, 5,873,153, 6,507,983, 6,384,697, 7,275,292 and 7,629,865 to Ruby et al.; U.S. Pat. No. 7,280,007 to Feng, et al.; U.S. Patent App. Pub. No. 2007/0205850 to Jamneala et al.; U.S. Pat. No. 7,388,454 to Ruby et al.; U.S. Patent App. Pub. No. 2010/0327697 to Choy et al.; and U.S. Patent App. Pub. No. 2010/0327994 to Choy et al. The entire contents of these patents and patent applications are hereby incorporated by reference. It is emphasized that the components, materials and method of fabrication described in these patents and patent applications are representative and other methods of fabrication and materials within the purview of one of ordinary skill in the art are contemplated.

Various embodiments relate to providing AlN thin film with an enhanced piezoelectric coefficient d33 and an enhanced electromechanical coupling coefficient $kt^2$ by incorporating multiple rare earth elements into the AlN crystal lattice. By incorporating specific atomic percentages of the multiple rare earth elements, the piezoelectric properties of the AlN, including piezoelectric coefficient d33 and enhanced electromechanical effective coupling coefficient $kt^2$, are improved as compared to stoichiometric AlN.

Figure 2A:
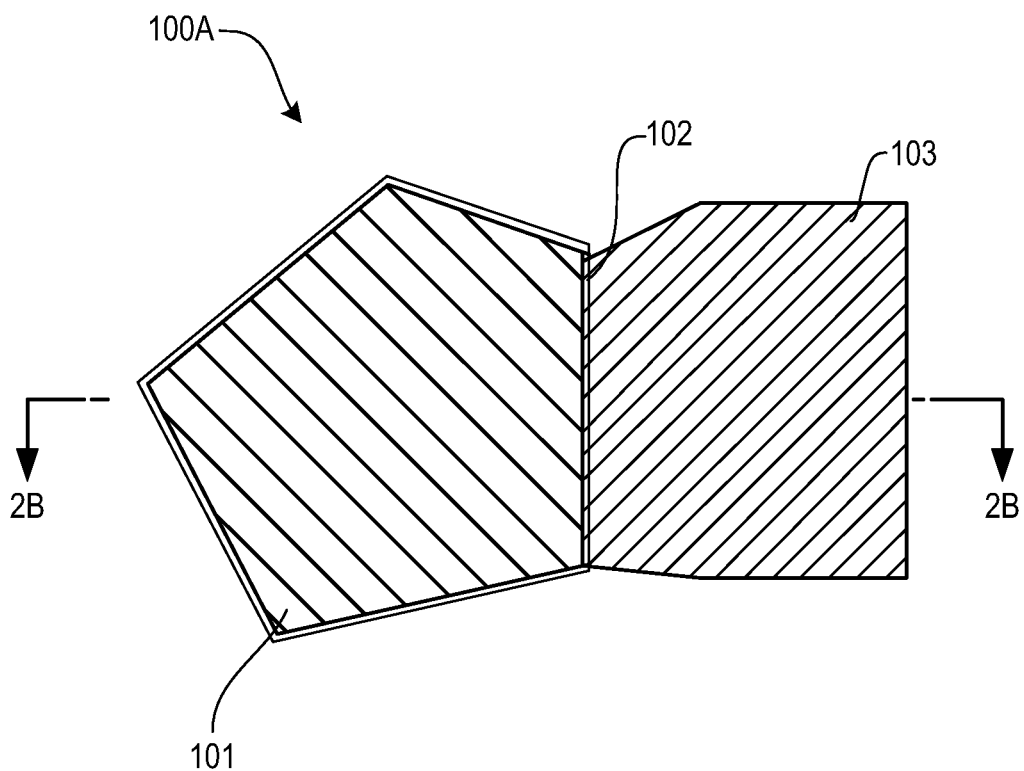
FIG. 2A shows a top-view of a thin film bulk acoustic resonator (FBAR) having doped piezoelectric layer, in accordance with a representative embodiment.

FIG. 2A shows a top view of FBAR 200 in accordance with a representative embodiment. The FBAR 200 includes a top electrode 101 having five (5) sides, with a connection side 102 configured to provide an electrical connection to interconnect 103. The interconnect 103 provides electrical signals to the top electrode 101 to excite desired acoustic waves in a piezoelectric layer (not shown in FIG. 2) of the FBAR 200.

Figure 2B:
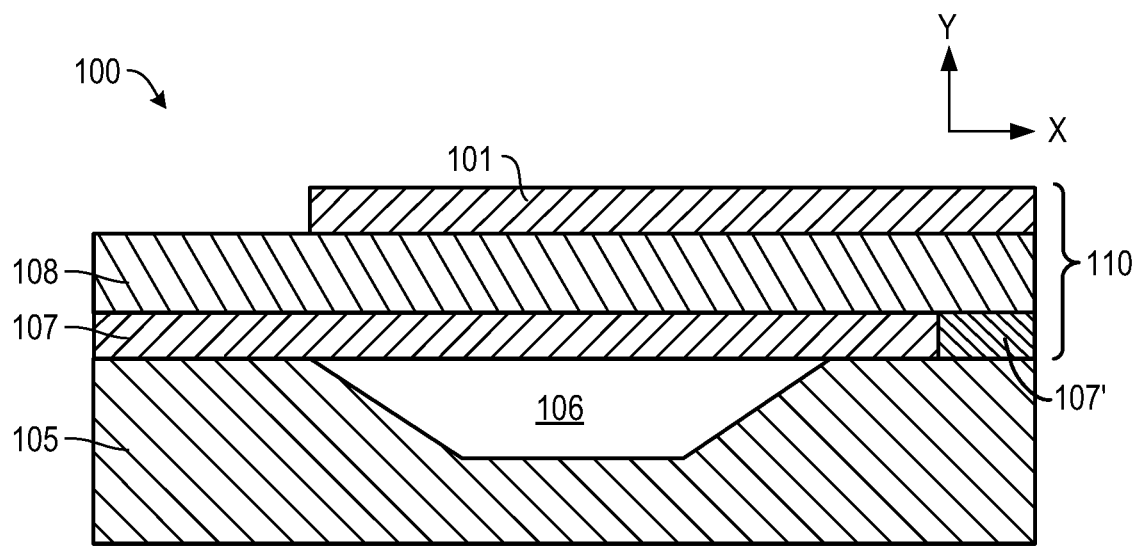
FIG. 2B is a cross-sectional view of the FBAR, taken along the line 2B-2B of FIG. 2A, having doped piezoelectric layer, in accordance with a representative embodiment.

FIG. 2B shows a cross-sectional view of the FBAR 200 taken along line 2B-2B in accordance with a representative embodiment. The FBAR 200 includes acoustic stack 110 formed of multiple layers over substrate 105 having a cavity 106. A first or bottom electrode 107 is disposed over the substrate 105, and extends over the cavity 106. A planarization layer 107' is also provided over the substrate as shown. In a representative embodiment, the planarization layer 107' includes non-etchable borosilicate glass (NEBSG), for example. In general, planarization layer 107' does not need to be present in the structure (as it increases overall processing cost), but when present, it may improve quality of growth of subsequent layers and simplify their processing. A piezoelectric layer 108 is disposed over the bottom electrode 107, and a second or top electrode 101 (shown in FIG. 2A) is disposed over the piezoelectric layer 108. As should be appreciated by one of ordinary skill in the art, the structure provided by the bottom electrode 107, the piezoelectric layer 108 and the top electrode 101 forms the acoustic stack 110 of a BAW resonator.

The substrate 105 may be formed of various types of materials, including semiconductor materials compatible with semiconductor processes, such as silicon (Si), gallium arsenide (GaAs), indium phosphide (InP), or the like, which is useful for integrating connections and electronics, thus reducing size and cost. Illustratively, the bottom electrode 107 and top electrode 101 are formed of tungsten (W) having a thickness of approximately 1000 Å to approximately 10000 Å. Other materials may be used for the bottom electrode 107 and the top electrode 101, including but not limited to molybdenum (Mo) or a bi-metal material. The cavity 106 may be formed using a sacrificial material, such as phosphosilicate glass (PSG), for example, which is subsequently released. The bottom electrode 107 may be applied to the top surface of the substrate 105 and the sacrificial material initially filling the cavity 115, and the top electrode 101 may be applied to the top surface of the piezoelectric layer 108, respectively, using a spin-on, sputtering, evaporation or chemical vapor disposition (CVD) technique, for example, to the desired thickness.

According to various embodiments, the piezoelectric layer 108 is formed of AlN "doped" with multiple rare earth elements, and has a thickness of approximately 5000 Å to approximately 25000 Å, for example. In particular, a number of Al atoms of the piezoelectric layer 108 within the AlN crystal lattice are replaced with more than one type of rare earth element at predetermined percentages, referred to as "doping elements." Because the doping elements replace only Al atoms (e.g., of an Al target), the percentage of nitrogen atoms in the piezoelectric layer 108 remains substantially the same regardless of the amount of doping. When percentages of doping elements are discussed herein, it is in reference to the total atoms (including nitrogen) of the AlN piezoelectric layer 108. The rare earth elements include scandium (Sc), yttrium (Y), lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb) and lutetium (Lu), as known by one of ordinary skill in the art. The various embodiments contemplate incorporation of any two or more rare earth elements, although specific examples are discussed below.

Figure 3:
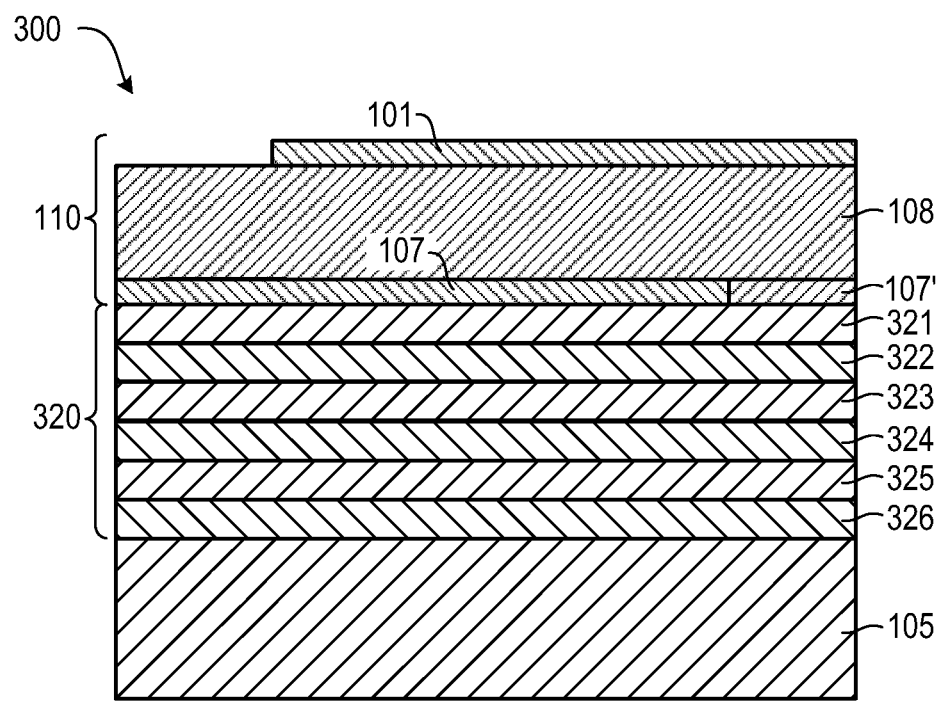
FIG. 3 is a cross-sectional view of a solidly mounted resonator (SMR) having doped piezoelectric layer, in accordance with a representative embodiment.

FIG. 3 shows a cross-sectional view of the SMR 300 in accordance with a representative embodiment. The various elements of the SMR 300 are substantially the same the corresponding elements discussed above with reference to the FBAR 200 in FIG. 2B, above, except that the SMR 300 includes acoustic reflector 320 formed over the substrate 105 to provide acoustic isolation in place of the cavity 106. The acoustic reflector 320 may be a distributed Bragg reflector (DBR) or other acoustic mirror, for example, formed of multiple acoustic impedance layers, indicated by representative first through sixth acoustic impedance layers 321 to 326. The first or bottom electrode 107 and the planarization layer 107' are disposed over the acoustic reflector 320, the piezoelectric layer 108 is disposed over the bottom electrode 107, and the second or top electrode 101 is disposed over the piezoelectric layer 108. As should be appreciated by one of ordinary skill in the art, the structure provided by the bottom electrode 107, the piezoelectric layer 108 and the top electrode 101 forms the acoustic stack 110 of a BAW resonator.

More particularly, the acoustic reflector 320 is grown on the top of the substrate 105 and provides acoustic isolation between the substrate 105 and the acoustic stack 110. The first through sixth acoustic impedance layers 321 to 326 of the acoustic reflector 320 are formed of materials having different acoustic impedances. For example, the first through sixth acoustic impedance layers 321 to 326 may have alternating low and high acoustic impedances, such that acoustic impedance layer 321 has relatively low acoustic impedance, acoustic impedance layer 322 has relatively high acoustic impedance, acoustic impedance layer 323 has relatively low acoustic impedance, acoustic impedance layer 324 has relatively high acoustic impedance, acoustic impedance layer 325 has relatively low acoustic impedance, and acoustic impedance layer 326 has relatively high acoustic impedance. These differing acoustic impedances can be obtained, for instance, by forming the odd numbered acoustic impedance layers 321, 323 and 325 of a relatively soft material, and forming the even numbered acoustic impedance layers 322, 324 and 326 of a relatively hard material. Notably, the number of acoustic impedance layers may differ from six, without departing from the scope of the present teachings. Generally, the number of acoustic impedance layers may be determined by a tradeoff between desired mirror performance (e.g., the more layers the better) and cost and processing issues (e.g., the fewer layers the cheaper and more straightforward mirror growth and post-processing).

The amount of acoustic isolation provided by acoustic reflector 320 generally depends on the contrast between the acoustic impedances of adjacent acoustic impedance layers 321 to 326, with a greater amount of contrast creating better acoustic isolation. In some embodiments, the acoustic reflector 320 is formed in pairs of dielectric materials having contrasting acoustic impedances. For example, the odd acoustic impedance layers 321, 323 and 325 may be formed of a material having low acoustic impedance, such as silicon oxide ($SiO_x$), where x is an integer, while the even acoustic impedance layers 322, 324 and 326, paired with corresponding odd acoustic impedance layers 321, 323 and 325, may be formed of a material having high acoustic impedance, such as tungsten (W) or molybdenum (Mo). In another example, the odd acoustic impedance layers 321, 323 and 325 may be formed of carbon-doped silicon oxide (CDO), while the even acoustic impedance layers 322, 324 and 326, paired with corresponding odd acoustic impedance layers 321, 323 and 325, may be formed of silicon nitride ($SiN_x$), where x is an integer. A benefit of this pair is that the layer may be grown in a single machine by depositing CDO onto a silicon wafer, for example, within a first chamber, moving the wafer to a second chamber, depositing silicon nitride on the wafer in the second chamber, moving the wafer back into the first chamber, and so on. This process may be less expensive (e.g., by about 10 percent) than producing an etched air cavity, for example, thus providing a cost effective substitute for an air cavity.

The acoustic reflector 320 and SMR 300 may be fabricated using various alternative techniques, an example of which is described in U.S. Pat. No. 7,358,831 to Larson, III et al., which is hereby incorporated by reference in its entirety. Of course, the low and high acoustic impedance materials forming the stacked layers of the acoustic reflector 320 may vary without departing from the scope of the present teachings. The present teachings contemplate the use of FBARs (e.g., FBAR 200) or SMRs (e.g., SMR 300) in a variety of applications, including filters (e.g., ladder filters comprising a plurality of BAW resonators).

For purposes of illustration, the piezoelectric layer 108 in FIGS. 2B and 3 may be formed of AlN doped with scandium (Sc) and erbium (Er). For example, the combined aluminum, scandium and erbium may be sputtered onto a seed layer grown on a top surface of the bottom electrode 120, or sputtered directly on the top surface of the bottom electrode 120, in the presence of an argon (Ar)-nitrogen ($N_2$) gas atmosphere inside a reaction chamber. More particularly, in various embodiments, a composite target (or multiple targets) formed of aluminum and desired proportions with scandium and erbium (thus effectively forming an Al—Sc—Er alloy) is provided in the reaction chamber. Application of AC power creates Ar—$N_2$ plasma with which the target reacts, resulting in sputter deposition of nitrogen, aluminum, scandium and erbium atoms in proportionate amounts to the seed layer (or to the top surface of the bottom electrode 120). The top surface of the bottom electrode 120 may be previously cleaned using Ar and/or hydrogen ($H_2$) gas. Examples of general AN sputter deposition processes are provided by U.S. Patent App. Pub. No. 2011/0180391 to Larson, III et al., published on Jul. 28, 2011, which is hereby incorporated by reference in its entirety.

In an embodiment, the target (or multiple targets) formed of aluminum with the desired proportions with rare earth elements (e.g., scandium and erbium) may be a previously formed alloy of aluminum and the rare earth elements mixed in the desired proportions. In an alternative embodiment, the target may be a composite target formed of substantially of aluminum, and the doping elements (e.g., scandium and erbium) are introduced by forming holes in the aluminum target and inserting "plugs" of scandium and erbium into the respective holes in the desired proportions. The percentage of each of the doping elements corresponds to the collective volume of that element inserted into one or more respective holes, which displaces a corresponding volume of aluminum. The size and number of holes, as well as the amount of the doping element filling each of the holes, may be determined on a case-by-case basis, depending on the desired percentages of the doping elements. For example, the holes may be drilled partially or entirely through the aluminum target in the desired sizes and numbers in various patterns. Similarly, in alternative embodiments, the rare earth elements may be added to the aluminum target in the desired proportions using various alternative types of insertions, without departing from the scope of the present teachings. For example, full or partial rings formed of the elements, respectively, may be inlaid in each aluminum target. The number, width, depth and circumference of each ring may be adjusted to provide the desired proportion of each particular element.

In alternative embodiments, the aluminum and doping elements may be sputtered onto the seed layer grown on the top surface of the bottom electrode 120, or sputtered directly on the top surface of the bottom electrode 120, using multiple targets formed of the different elements, respectively. For example, an Al—Sc—Er alloy may be applied using an aluminum target, a scandium target and an erbium target separately reacting to the Ar—$N_2$ plasma. The desired proportions of the elements (e.g., the aluminum and the two or more rare earth element dopants) may be obtained by varying the AC power applied to each of the targets and/or the sizes of the targets in relation to one another. Of course, any other process for applying rare earth elements in desired proportions to form a doped piezoelectric layer may be used without departing from the scope of the present teachings.

Generally, the aluminum and nitrogen are proportioned at approximately 50 percent each (i.e., the overall atomic percentage of the Al is approximately 50). As mentioned above, the scandium and erbium replace aluminum atoms (in the AlN crystal lattice), while the proportionate amount of nitrogen stays substantially the same. So, for example, the aluminum target may contain about 5 percent scandium and 5 percent erbium, in which case the aluminum in the doped piezoelectric layer 108 has an atomic percentage of approximately 45, while the each of the scandium and the erbium in the piezoelectric layer 108 has an atomic percentage of approximately 2.5. The atomic consistency of the piezoelectric layer 108 may then be represented as $Al_{0.45}N_{0.50}Sc_{0.025}Er_{0.025}$, for example.

In various embodiments, the amount of each of the scandium and erbium dopants present in the piezoelectric layer 108 may be less than approximately ten atomic percent, for example. Also, in various embodiments, the amount of each of the scandium and erbium dopants present in the piezoelectric layer 108 may be less than approximately one atomic percent, an example of which is discussed below. Notably, significant improvement in coupling coefficient $kt^2$ is seen in embodiments using even very small amounts of dopants. Also, although described with reference to a piezoelectric layer 108 formed of AlN doped with scandium and erbium, it is understood that the piezoelectric layer 108 may be doped with two or more other rare earth elements in substantially the same manner, without departing from the scope of the present teachings. For example, the piezoelectric layer 108 may be formed of doped AlN, using an Al—Sc—Y alloy, an Al—Er—Y alloy or an Al—Sc—Er—Y alloy, where each of the doping elements has an atomic percentage less than about 10. Also, the general concept of doping the piezoelectric layer 108 with multiple rare earth elements may be applied to other piezoelectric materials, such as zinc oxide (ZnO) or lead zirconate titanate (PZT), without departing from the scope of the present teachings.

Table 1 shows percentage improvement in coupling coefficient $kt^2$ of an SMR (e.g., SMR 300) having a piezoelectric layer formed of AlN doped with scandium and erbium over a standard SMR having a piezoelectric layer formed only of AlN. Also, for purposes of comparison, Table 1 shows percentage improvements in coupling coefficient $kt^2$ of SMRs having piezoelectric layers formed of AlN doped only with scandium and only with erbium, respectively, over the standard SMR having a piezoelectric layer formed of AlN.

TABLE 1

| Doping Element added to AlN | Atomic concentration in AlN (in percentage) | Improvement in $kt^2$ over Standard AlN (in percentage) |
| --- | --- | --- |
| Erbium only | 0.27% | 0.20% |
| Scandium only | 0.77% | 0.25% |
| Erbium | 0.34% | 0.47% |
| Scandium | 0.63% | |

Atomic concentration is an arithmetic average of Rutherford backscattering spectrometry (RBS) measurements taken at the top, center and bottom of a sample wafer containing the SMR. For orientation purposes, the bottom of the wafer is the major flat of the wafer. Also, the percentage improvement in the coupling coefficient $kt^2$ is the increase in the wafer median above the wafer median for standard AlN (i.e., having no doping elements).

Referring to Table 1, the piezoelectric layer formed of AlN doped with about 0.27 atomic percent erbium provides about a 0.20 percent increase in coupling coefficient $kt^2$ over the standard SMR (having a piezoelectric layer comprising undoped AlN). The piezoelectric layer formed of AlN doped with about 0.77 atomic percent scandium provides about a 0.25 percent increase in coupling coefficient $kt^2$ over the standard SMR. In comparison, the piezoelectric layer formed of AlN doped with about 0.34 atomic percent erbium and about 0.63 atomic percent scandium provides about a 0.47 percent increase in coupling coefficient $kt^2$ over the standard SMR. This indicates that the improvement (increase) in the coupling coefficient $kt^2$ of the piezoelectric layer using AlN doped with two rare earth elements increases substantially over a piezoelectric layer using AlN doped with only one of the same two rare earth elements. Indeed, the AlN doped with scandium and erbium has an approximately 135 percent increase in the coupling coefficient $kt^2$ over the AlN doped only with about the same amount of erbium, and approximately 88 percent increase in the coupling coefficient $kt^2$ over the AN doped only with about the same amount of scandium.

In alternative embodiments, piezoelectric layers doped with two or more rare earth elements may be formed in resonator stacks of various other types of resonator devices, without departing from the scope of the present teachings. For example, a piezoelectric layer doped with two or more rare earth elements may be formed in resonator stacks of a stacked bulk acoustic resonator (SBAR) device, a double bulk acoustic resonator (DBAR) device, or a coupled resonator filter (CRF) device.

In accordance with illustrative embodiments, BAW resonator structures comprising piezoelectric layers formed of materials alloyed with multiple rare earth elements are described. One of ordinary skill in the art would appreciate that many variations that are in accordance with the present teachings are possible and remain within the scope of the appended claims. These and other variations would become clear to one of ordinary skill in the art after inspection of the specification, drawings and claims herein. The invention therefore is not to be restricted except within the spirit and scope of the appended claims.

The invention claimed is:

1. A bulk acoustic wave (BAW) resonator structure, comprising:
    a first electrode disposed over a substrate;
    a piezoelectric layer disposed over the first electrode, the piezoelectric layer comprising a piezoelectric material doped with a plurality of rare earth elements for improving piezoelectric properties of the piezoelectric layer; and
    a second electrode disposed over the piezoelectric layer.

2. The BAW resonator according to claim 1, wherein the piezoelectric material comprises aluminum nitride (AlN).

3. The BAW resonator according to claim 2, wherein the plurality of rare earth elements comprises two rare earth elements incorporated into a crystal lattice of the AlN piezoelectric material.

4. The BAW resonator according to claim 3, wherein the plurality of rare earth elements comprises scandium (Sc) and erbium (Er).

5. The BAW resonator according to claim 4, wherein the plurality of rare earth elements further comprises yttrium (Y).

6. The BAW resonator according to claim 4, wherein a concentration of each of the scandium and the erbium is less than approximately 10 atomic percent of the piezoelectric material.

7. The BAW resonator according to claim 6, wherein the concentration of each of the scandium and the erbium is less than approximately one atomic percent of the piezoelectric material.

8. The BAW resonator according to claim 7, wherein the concentration of scandium is approximately 0.63 atomic percent of the piezoelectric material, and the concentration of erbium is approximately 0.34 atomic percent of the piezoelectric material.

9. The BAW resonator according to claim 2, wherein the plurality of rare earth elements comprises more than two rare earth elements incorporated into a crystal lattice of the AlN piezoelectric material.

10. The BAW resonator according to claim 2, wherein the piezoelectric layer is provided using a target formed of an alloy comprising aluminum and the plurality of doping elements, and sputtering the aluminum alloy from the target over the bottom electrode using a plasma comprising nitrogen.

11. The BAW resonator according to claim 1, wherein the piezoelectric layer is provided using a plurality of targets formed of aluminum and the plurality of doping elements, respectively, and sputtering the aluminum and the plurality of doping elements from the corresponding targets over the bottom electrode using a plasma comprising nitrogen.

12. A thin film bulk acoustic resonator (FBAR) structure, comprising:
- a substrate defining a cavity;
- a first electrode disposed over the substrate, at least a portion of the first electrode being formed over the cavity in the substrate;
- a piezoelectric layer disposed over the first electrode, the piezoelectric layer comprising a piezoelectric material doped with a plurality of rare earth elements for improving piezoelectric properties of the piezoelectric layer; and
- a second electrode disposed over the piezoelectric layer.

13. The FBAR structure resonator according to claim 12, wherein the piezoelectric material comprises aluminum nitride (AlN).

14. The FBAR structure resonator according to claim 13, wherein the plurality of rare earth elements comprises scandium (Sc) and erbium (Er).

15. The FBAR structure according to claim 14, wherein a concentration of each of the scandium and the erbium is less than approximately one atomic percent of the AlN.

16. A solidly mounted resonator (SMR) structure, comprising:
- a substrate;
- an acoustic reflector formed on the substrate, the acoustic reflector comprising a plurality of acoustic impedance layers, wherein at least two of the acoustic impedance layers have different acoustic impedances;
- a first electrode disposed over the acoustic reflector;
- a piezoelectric layer disposed over the first electrode, the piezoelectric layer comprising a piezoelectric material doped with a plurality of rare earth elements for improving piezoelectric properties of the piezoelectric layer; and
- a second electrode disposed over the piezoelectric layer.

17. The SMR structure according to claim 16, wherein the acoustic reflector comprises a distributed Bragg reflector (DBR).

18. The SMR structure according to claim 17, wherein the piezoelectric material comprises aluminum nitride (AlN).

19. The SMR structure according to claim 18, wherein the plurality of rare earth elements comprises scandium (Sc) and erbium (Er).

20. The SMR structure according to claim 19, wherein a concentration of each of the scandium and the erbium is less than approximately 10 atomic percent of the AlN.

* * * * *